(12) United States Patent
Sekimoto et al.

(10) Patent No.: US 9,933,462 B2
(45) Date of Patent: Apr. 3, 2018

(54) CURRENT SENSOR AND CURRENT MEASURING DEVICE

(71) Applicant: Yamaha Corporation, Hamamatsu-Shi, Shizuoka-Ken (JP)

(72) Inventors: Yasuhiko Sekimoto, Hamamatsu (JP); Norihiro Kawagishi, Hamamatsu (JP); Katsuya Hirano, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 440 days.

(21) Appl. No.: 14/666,725

(22) Filed: Mar. 24, 2015

(65) Prior Publication Data

US 2015/0276817 A1    Oct. 1, 2015

(30) Foreign Application Priority Data

Mar. 27, 2014  (JP) .................................. 2014-066393

(51) Int. Cl.
 *G01R 15/20*  (2006.01)
(52) U.S. Cl.
 CPC .................................. *G01R 15/207* (2013.01)
(58) Field of Classification Search
 None
 See application file for complete search history.

(56) References Cited

U.S. PATENT DOCUMENTS

| 7,492,554 B2 * | 2/2009 | Breuer | G01R 33/0206 |
| | | | 360/313 |
| 2009/0295368 A1 * | 12/2009 | Doogue | G01R 15/207 |
| | | | 324/117 H |

FOREIGN PATENT DOCUMENTS

JP    2012-063285    3/2012

* cited by examiner

*Primary Examiner* — Melissa Koval
*Assistant Examiner* — Courtney McDonnough
(74) *Attorney, Agent, or Firm* — Blank Rome LLP

(57) ABSTRACT

A current sensor includes an element substrate that has a first surface facing a wire to which electric current to be measured is supplied and a second surface positioned on the opposite side of the first surface; a pair of sloping surfaces that are formed mutually juxtaposed in the element substrate so as to have slope angles by which their mutual spacing gradually decreases in a first direction approximately orthogonal with the first surface heading from the first surface to the second surface; a pair of magnetism detecting elements that are respectively attached to the pair of sloping surfaces formed in the element substrate; and external connection terminals that are respectively connected to the pair of magnetism detecting elements and that extend in a second direction that is the opposite direction of the first direction, in which the sensitivity directions of the pair of magnetism detecting elements are respectively set so as to slope along the pair of sloping surfaces.

7 Claims, 8 Drawing Sheets

CURRENT SENSOR AND CURRENT MEASURING DEVICE

BACKGROUND OF THE INVENTION

Field of the Invention

The present invention relates to a current sensor and a current measuring device.

Priority is claimed on Japanese Patent Application No. 2014-66393, filed Mar. 27, 2014, the content of which is incorporated herein by reference.

Description of Related Art

There is conventionally known a current sensor that, by detecting with a magnetism detecting element the strength of the magnetic field produced by electric current flowing through a bus bar, measures the value of the electric current correlating with the strength of the magnetic field.

The current sensor that is disclosed in Japanese Unexamined Patent Application, First Publication No. 2012-63285 is provided with a conductive member that is formed in an approximate U-shape in plan view, and two magnetic elements that are arranged between mutually facing conductive paths of the conductive member. In this current sensor, the strength of the magnetic field generated by electric current passing through the conductive member is individually detected by the two magnetic elements, and a current value correlating with the strength of the magnetic field is found from the strength of the magnetic field that is obtained. Also, this current sensor has a constitution that cancels out the influence of a disturbance magnetic field causing measurement error by differentially operating the two magnetic elements.

The current sensor with the aforementioned constitution can measure electric current passing through a current path of the measurement target by severing the current path that is the measurement target and inserting the conductive member of the current sensor in the current path. For that reason, with the aforementioned current sensor it is not possible to measure an electric current without severing the existing current path.

SUMMARY OF THE INVENTION

The present invention was achieved in view of the aforementioned circumstances, and has as its object to provide a current sensor that is capable of accurately measuring an electric current without severing the current path that is the measurement target. Also, it has as an object to provide a current measuring device having this kind of current sensor and being capable of accurately measuring the current value of an electric current passing through a wire.

In order to solve the aforementioned issue, the current sensor according to one aspect of the present invention has an element substrate that has a first surface facing a wire to which electric current to be measured is supplied and a second surface positioned on the opposite side of the first surface; a pair of sloping surfaces that are formed mutually juxtaposed in the element substrate so as to have slope angles by which their mutual spacing gradually decreases in a first direction approximately orthogonal with the first surface heading from the first surface to the second surface; a pair of magnetism detecting elements that are respectively attached to the pair of sloping surfaces formed in the element substrate; and external connection terminals that are respectively connected to the pair of magnetism detecting elements and that extend in a second direction that is the opposite direction of the first direction, in which the sensitivity directions of the pair of magnetism detecting elements are respectively set so as to slope along the pair of sloping surfaces.

Also, the current measuring device according to one aspect of the present invention has a wiring substrate in which a wire is provided on the front surface; and a current sensor having an element substrate that has a first surface facing the wire and a second surface positioned on the opposite side of the first surface; a pair of sloping surfaces that are formed mutually juxtaposed in the element substrate so as to have slope angles by which their mutual spacing gradually decreases in a first direction approximately orthogonal with the first surface heading from the first surface to the second surface; a pair of magnetism detecting elements that are respectively attached to the pair of sloping surfaces formed in the element substrate; and external connection terminals that are respectively connected to the pair of magnetism detecting elements and that extend in a second direction that is the opposite direction of the first direction, the sensitivity directions of the pair of magnetism detecting elements being respectively set so as to slope along the pair of sloping surfaces, in which the current sensor is provided spaced apart from the wire, the pair of magnetism detecting elements are arranged so as to be positioned on both sides thereof sandwiching the center line of the wire, and the separation distance of the pair of magnetism detecting elements gradually decreases in the normal direction of the wire.

According to the present invention, it is possible to provide a current sensor that is capable of accurately measuring an electric current without severing the current path that is the measurement target. Also, it is possible to provide a current measuring device having this kind of current sensor and being capable of accurately measuring the current value of an electric current passing through a wire.

DETAILED DESCRIPTION OF THE INVENTION

First Embodiment

Hereinbelow, the current sensor and current measuring device of the first embodiment of the present invention shall be described below, referring to FIG. 1 to FIG. 7C. Note that in all of the following drawings, the dimensions and ratios of each constituent element are suitably altered in order to facilitate understanding.

Figure 1:
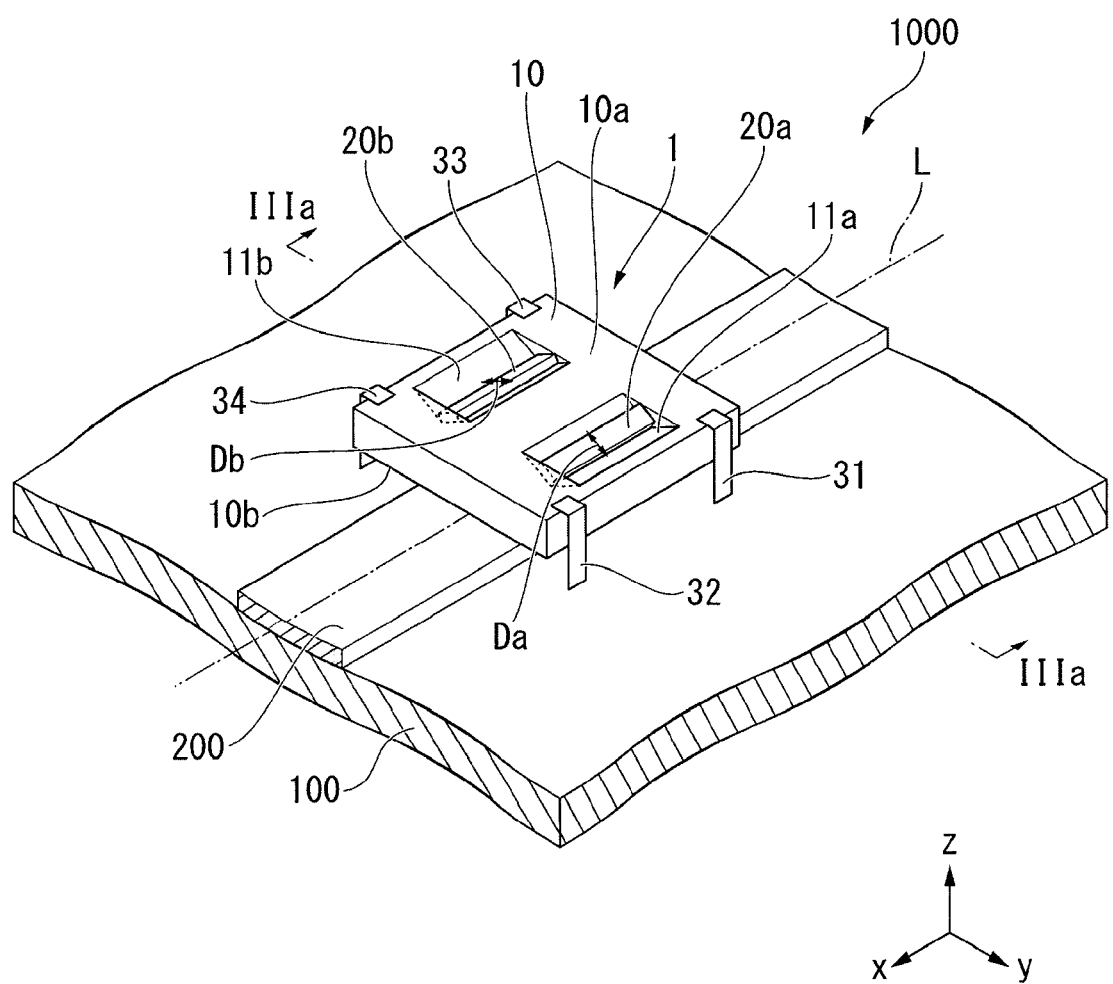
FIG. 1 is a perspective view that shows the current sensor and current measuring device of the first embodiment of the present invention.

FIG. 1 is an outline perspective view that shows a current sensor 1 and a current measuring device 1000 of the first embodiment. As shown in the drawing, the current measuring device 1000 has the current sensor 1 and a wiring substrate 100 on whose front surface a wire 200 is provided.

In the following drawings, an XYZ coordinate system is established, and the positional relation of each member shall be described with reference to this XYZ coordinate system. In the XYZ coordinate system, with respect to the X-axis direction, which is set within the surface of the wiring substrate 100, the Y-axis direction is set to a direction that is perpendicular within the surface, and the direction that is perpendicular with both the X-axis direction and the Y-axis direction is made the Z-axis direction. That is to say, the XY-plane is set to the same plane direction as the surface of the wiring substrate 100, and the Z-axis is set to the normal direction of the wiring substrate 100.

Also, in the present specification, "plan view" refers to the field of view when viewing from the +Z-direction to the −Z-direction.

The current sensor 1 has an element substrate 10, a pair of magnetism detecting elements 20a and 20b, and external connection terminals 31 to 34.

The element substrate 10 is a substrate with a rectangular shape in plan view. In FIG. 1, the element substrate 10 is arranged so that the front surface 10a is in the same direction as the surface direction of the XY-plane. The element substrate 10 is formed from for example SiO$_2$/Si, glass, or quartz.

Grooves 11a and 11b that extend along opposite edges of the element substrate 10 in plan view, parallel with the X-direction, are provided in the front surface 10a of the element substrate 10. The grooves 11a and 11b are arrayed in a direction (Y-direction) that is orthogonal with their extension direction (X-direction), and are provided spaced apart in that orthogonal direction.

The pair of magnetism detecting elements 20a and 20b are respectively arranged in the interior of the grooves 11a and 11b provided in the front surface 10a of the element substrate 10. Note that the drawing shows each of the magnetism detecting elements 20a and 20b being constituted in a rectangular parallelepiped shape. However, in greater detail, the magnetism detecting element 20a and the magnetism detecting element 20b may each be constituted from two elements, with the outputs of these four elements being bridge connected.

As the pair of magnetism detecting elements 20a and 20b, it is possible to use elements such as Hall elements or magneto-resistance effect elements. Examples of magneto-resistance effect elements include giant magneto-resistance (GMR) elements, tunnel magneto-resistance elements and the like. In the present embodiment, GMR elements are used as the pair of magnetism detecting elements 20a and 20b.

Figure 2A:
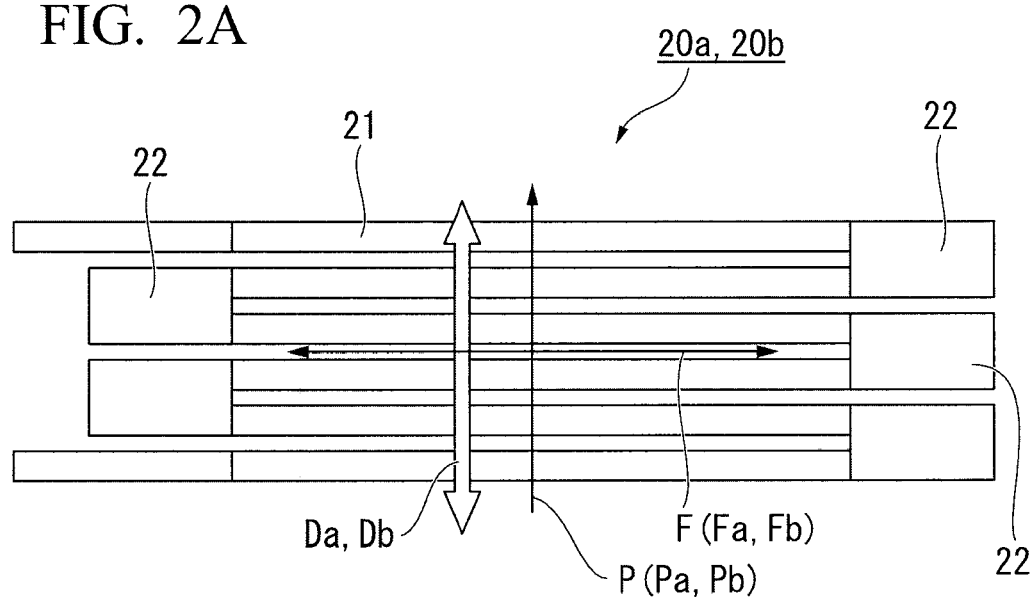
FIG. 2A and FIG. 2B are respectively a plan view and a cross-sectional view showing the GMR element used as a magnetism detecting element in the first embodiment.
Figure 2B:
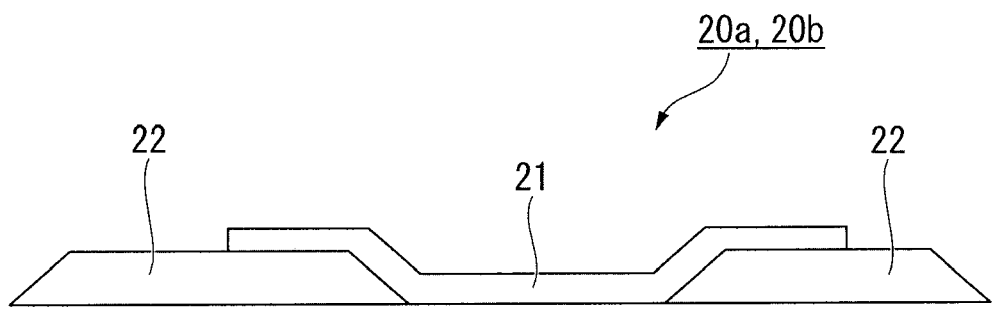

FIGS. 2A and 2B are respectively a plan view and a cross-sectional view showing the constitution of the pair of magnetism detecting elements 20a and 20b, which are GMR elements.

As shown in FIG. 2A and FIG. 2B, the pair of magnetism detecting elements 20a and 20b each have a plurality of belt-like portions 21 (six are shown in the drawing) that are arranged in parallel mutually adjacent to each other, and a lead layer 22 that connects the belt-like portions 21.

Each belt-like portion 21 is formed by a laminate of a metal thin film that exhibits a giant magneto-resistance effect. The belt-like portion 21 is constituted by sequentially laminating a free layer, a conductive spacer layer, a pinned layer, and a capping layer that are laminated on the element substrate 10.

The free layer is a layer whose magnetic orientation changes in response to the direction of an external magnetic field. For example, it comprises a cobalt-zirconium-niobium (CoZrNb) amorphous magnetic layer, a nickel-iron (NiFe) magnetic layer, and a cobalt-iron (CoFe) layer laminated in that sequence on the surface of the element substrate 10. The thickness of the CoZrNb amorphous magnetic layer is for example 8.0 nm. The thickness of the NiFe magnetic layer is for example 3.3 nm. The thickness of the CoFe layer is for example 1.2 nm.

Both the CoZrNb amorphous magnetic layer and the NiFe magnetic layer are soft ferromagnetic thin film layers. The CoFe layer has a function of raising the magneto-resistance (MR) ratio, which indicates the rate of resistance change when an external magnetic field is applied to the magnetism detecting element.

As the conductive spacer layer, it is possible to specify for example a copper (Cu) layer whose thickness is 2.4 nm.

The pinned layer is a layer in which the magnetization direction thereof is fixed (pinned) in a predetermined direction. As the pinned layer, it is possible to specify a layer in which for example a cobalt-iron (CoFe) magnetic layer and a platinum-manganese (PtMn) antiferromagnetic layer are laminated in this sequence on the surface of the spacer layer. The thickness of the cobalt-iron (CoFe) magnetic layer is for example 2.2 nm. The platinum-manganese (PtMn) antiferromagnetic layer is a layer composed of a platinum-manganese (PtMn) alloy containing 45~55 mol % of platinum as a formation material, and whose thickness is for example 4.0 nm.

The CoFe magnetic layer is lined with the magnetized PtMn antiferromagnetic film in an exchange coupling manner so as to constitute the pinned layer whose magnetization direction (magnetization vector) is fixed.

As the capping layer, it is possible to specify for example a tantalum (Ta) layer whose thickness is 2.4 nm.

The lead layer 22 is arranged in a plurality at both ends of the plurality of belt-like portions 21, and connects the plurality of belt-like portions 21 in series. As the lead layer 22, it is possible to specify for example a chromium (Cr) layer whose thickness is 0.3 μm.

In the magnetism detecting elements 20a and 20b as described above, the electrical resistance of the spacer layer changes in accordance with the relative relation of the direction of magnetization of the pinned layer and the direction of magnetization of the free layer due to the giant magneto-resistance effect by an external magnetic field. For that reason, by specifying as the output the resistance value when the spacer layer is made to conduct electricity, it is possible to detect the strength of the external magnetic field.

In the magnetism detecting elements 20a and 20b shown in FIG. 2A and FIG. 2B, the direction of magnetization of the pinned layer is fixed to a direction that is orthogonal with the lengthwise direction in plan view. In the drawings, the direction of magnetization of the pinned layer is shown by the arrow labeled by the letter P (magnetization direction P of the pinned layer). Also, the direction of magnetization of the free layer during non-application of a magnetic field is shown by the arrow labeled by the letter F (magnetization direction F of the free layer).

In addition, during non-application of a magnetic field, in the magnetism detecting elements 20a and 20b, the magnetization direction F of the free layer is the same direction as the lengthwise direction in plan view. The magnetization direction F of the free layer is orthogonal with the magnetization direction P of the pinned layer.

Here, in the present specification, the direction in a magnetism detecting element in which a magnetic field applied from outside can be detected most favorably shall be termed the "sensitivity direction". In the magnetism detecting elements 20a and 20b, which are GMR elements, when an external magnetic field becomes the same direction as the magnetization direction F of the free layer, they become non-sensitive. On the other hand, when the external magnetic field becomes a direction orthogonal with the magnetization direction F of the free layer, the magnetization direction F of the free layer is most influenced by the external magnetic field. Accordingly, the sensitivity direction of the magnetism detecting elements 20a and 20b shown in the drawing is the same direction as the magnetization direction P of the pinned layer, which is set to a direction orthogonal with the magnetization direction F of the free layer.

In FIGS. 2A and 2B, the sensitivity direction of the magnetism detecting elements 20a and 20b is shown using the signs Da and Db.

Returning to FIG. 1, the external connection terminals 31 to 34 consist of external connection terminals 31 and 32 that are connected to the magnetism detecting element 20a, and external connection terminals 33 and 34 that are connected to the magnetism detecting element 20b. The external connection terminals 31 to 34 extend to the back surface 10b of the element substrate 10. In FIG. 1, one end of each of the external connection terminals 31 to 34 connects to the element substrate 10, and the other end extends in a direction orthogonal with the front surface 10a (the −Z-direction, or second direction), and is connected to a connection wire (not illustrated) of the wiring substrate 100. During use of the current sensor 1, electric current is supplied to the magnetism detecting elements 20a and 20b via the connection wire of the wiring substrate 100.

Note that in the present invention, the external connection terminals 31 and 32 may be directly connected to the magnetism detecting element 20a, and may be indirectly connected via an amplifier circuit provided in the current sensor 1. The external connection terminals 33 and 34 similarly may be directly connected to the magnetism detecting element 20b, and may be indirectly connected via an amplifier circuit.

Also, in the present embodiment, the external connection terminals 31 and 32 are connected with the magnetism detecting element 20a, and the external connection terminals 33 and 34 are connected with the magnetism detecting element 20b, but the magnetism detecting elements 20a and 20b to which the external connection terminals 31 to 34 are connected may be arbitrarily changed.

Also, in the case of the external connection terminals and the magnetism detecting elements being connected via an amplifier circuit as stated above, the number of external connection terminals may be increased.

Also, the magnetism detecting element 20a is constituted from two elements, and the magnetism detecting element 20b is constituted from two elements, and so in the case of obtaining the output by bridge connecting the four elements constituting the magnetism detecting elements 20a and 20b in the current sensor 1, the external connection terminals may be increased.

Figure 3A:
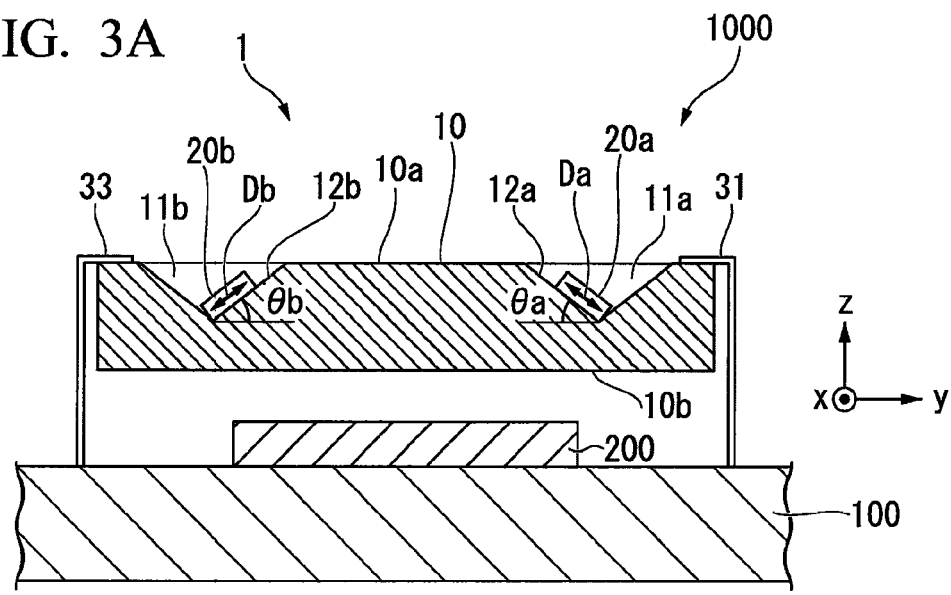
FIG. 3A and FIG. 3B are respectively a cross-sectional view and a plan view showing the current sensor and the current measuring device of the first embodiment.
Figure 3B:
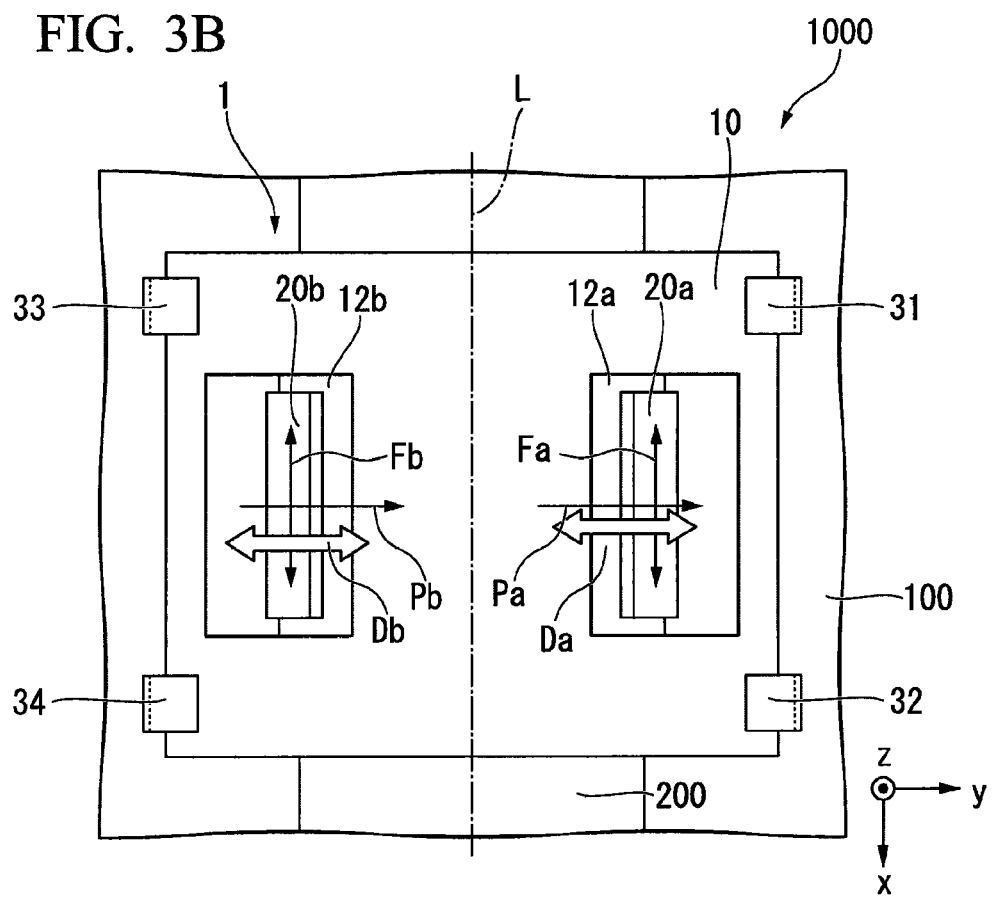

FIGS. 3A and 3B are explanatory drawings showing the current sensor 1 and the current measuring device 1000 of the present embodiment, with FIG. 3A being an arrow view cross-sectional view taken along the line IIIa-IIIa of FIG. 1, and FIG. 3B being a plan view.

As shown in FIG. 3A, the element substrate 10 is mounted on the wiring substrate 100 by the external connection terminals 31 and 33 and the like. A wire 200 that extends in the X-direction is formed on the wiring substrate 100. The element substrate 10 is installed with its back surface (first surface) 10b facing the wire 200. The back surface (first surface) 10b of the element substrate 10 is arranged spaced apart from the wire 200 in the Y-direction. The current sensor 1 detects the electric current that passes through the wire 200 in the X-direction.

The grooves 11a and 11b that are provided in the front surface (second surface) 10a of the element substrate 10 form a wedge shape in cross section. The pair of magnetism detecting elements 20a and 20b are respectively provided in the grooves 11a and 11b, on a pair of sloping surfaces 12a and 12b on the inner side of the element substrate 10. The mutual spacing between the sloping surfaces 12a and 12b gradually decreases in the first direction (+Z-direction) heading from the back surface (first surface) 10b to the front surface (second surface) 10a of the element substrate 10.

The slope angle of each of the sloping surfaces 12a and 12b with respect to the back surface (first surface) 10b of the element substrate 10 can be controlled by design. In the element substrate 10 of the present embodiment, the slope angle θa of the sloping surface 12a and the slope angle θb of the sloping surface 12b are equivalent. For that reason, the slope angles of the pair of magnetism detecting elements 20a and 20b with respect to the back surface (first surface) 10b of the element substrate 10 are also equivalent.

In addition, as shown in FIG. 3B, the pair of magnetism detecting elements 20a and 20b are provided so that their lengthwise direction agrees with the extension direction of the grooves 11a and 11b.

The pair of magnetism detecting elements 20a and 20b that are provided on the sloping surfaces 12a and 12b are arrayed in the width direction (Y-direction) of the wire 200 in plan view, being arranged on both sides thereof sandwiching the center line L of the wire 200. In the current measuring device 1000 of the present embodiment, the pair of magnetism detecting elements 20a and 20b are disposed line-symmetrically with respect to the center line L.

In addition, the positions of the pair of magnetism detecting elements 20a and 20b in the Z-axis direction (normal direction) with respect to the wire 200 are equivalent, being disposed at positions opposite the end portions of the wire 200 in the width direction, that is to say, overlapping them in plan view (overlapping in the Z-direction visual field). The separation distance between the pair of magnetism detecting elements 20a and 20b gradually decreases in the direction heading from the back surface (first surface) 10b to the front surface (second surface) 10a of the element substrate 10 (the normal direction of the wire 200, or +Z-direction).

Moreover, the sensitivity directions Da and Db of the pair of magnetism detecting elements 20a and 20b are set so as to slope along the sloping surfaces 12a and 12b. The pair of magnetism detecting elements 20a and 20b having such respective sensitivity directions Da and Db will thus possess sensitivity in the Y-axis direction and the Z-axis direction.

In a cross-sectional view, the relative distances of the pair of magnetism detecting elements 20a and 20b with respect to the end portions of the wire 200 are equivalent, their positions in the Z-axis direction are equivalent, and moreover their respective rotation attitudes about the X axis are set so as to be symmetrical with respect to the center line L of the wire 200.

As shown in FIG. 1, and FIGS. 3A and 3B, the wire 200 is provided on the front surface of the wiring substrate 100. In FIG. 1, the wire 200 is shown extending in the X-axis direction. In addition, the current sensor 1 overlaps the wire 200 in plan view, being provided spaced apart from the wire 200 in the normal direction (+Z-direction) of the wiring substrate 100.

Figure 4:
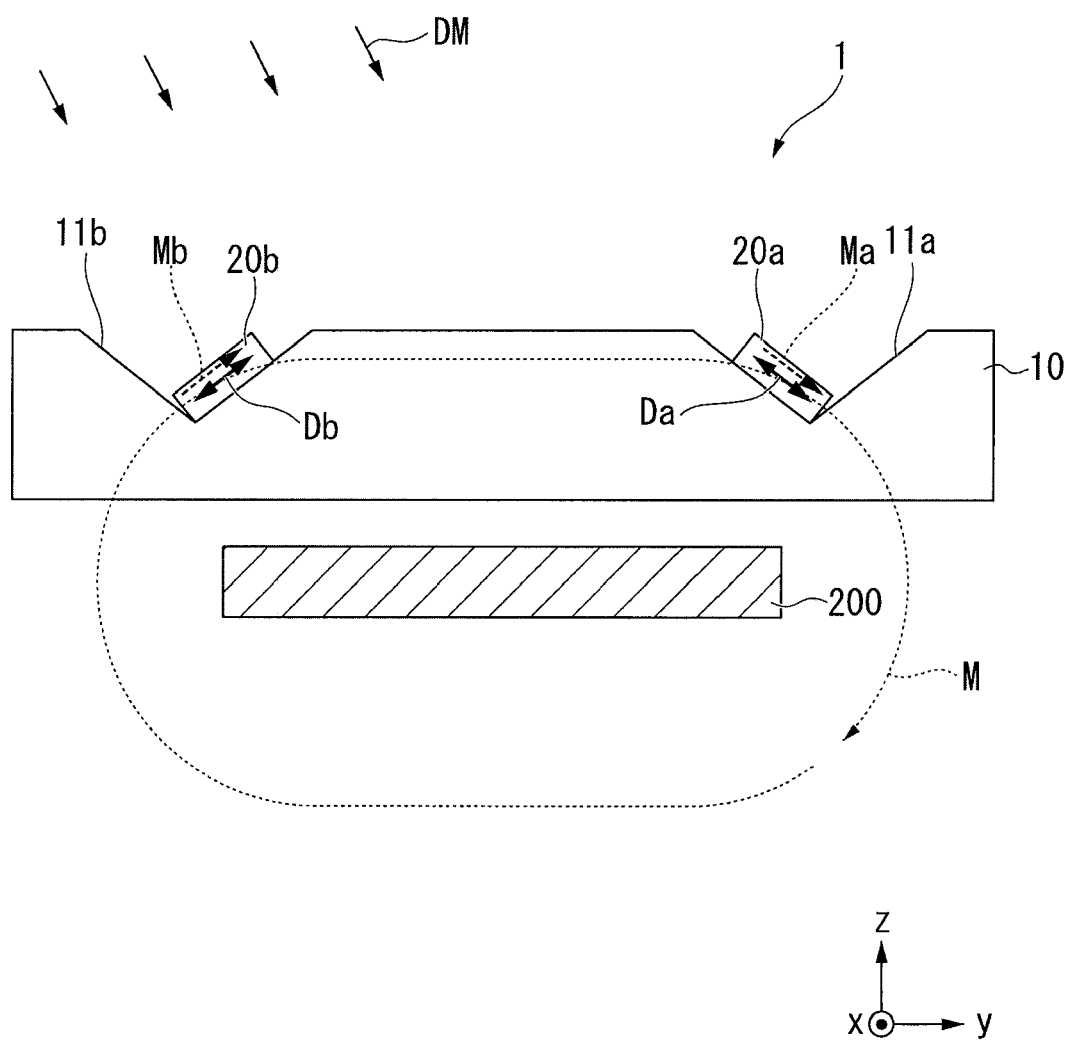
FIG. 4 is a cross-sectional view that shows the function of the current sensor of the first embodiment.

FIG. 4 is an explanatory drawing that explains the function of the current sensor 1, being a cross-sectional view in the same visual field as FIG. 3A.

As shown in FIG. 4, when electric current that flows in the −X-direction is supplied to the wire 200, an induction field is produced in the wire 200 in accordance with the corkscrew law or Ampere's law. In the drawing, the induction field that is produced in the wire 200 is denoted by the sign M.

At this time, the induction field M is detected by each of the magnetism detecting elements 20a and 20b. Specifically, when the pair of magnetism detecting elements 20a and 20b are exposed to this kind of induction field M, they detect the tangential components Ma and Mb of the induction field.

Here, the positions (elevation angle, separation distance) of the magnetism detecting elements 20a and 20b with respect to the wire 200 are known. For that reason, it is possible to find the value of the electric current flowing through the wire 200 from the tangential components Ma and Mb that are detected.

Also, since the magnetism detecting elements 20a and 20b are provided on the sloping surfaces 12a and 12b of the grooves 11a and 11b, compared to the case of the magnetism detecting elements 20a and 20b being provided on the front surface 10a of the element substrate 10, it is possible to align the sensitivity directions Da and Db with the directions of the tangential components Ma and Mb (that is, reduce the angle formed by the sensitivity directions Da and Db and the respective directions of the tangential components Ma and Mb). Therefore, it is possible to raise the detection sensitivity for the induction field M by the magnetism detecting elements 20a and 20b.

Here, a simulation result for the strength of the magnetic field detected by the magnetism detecting elements 20a and 20b shall be shown.

Figure 5A:
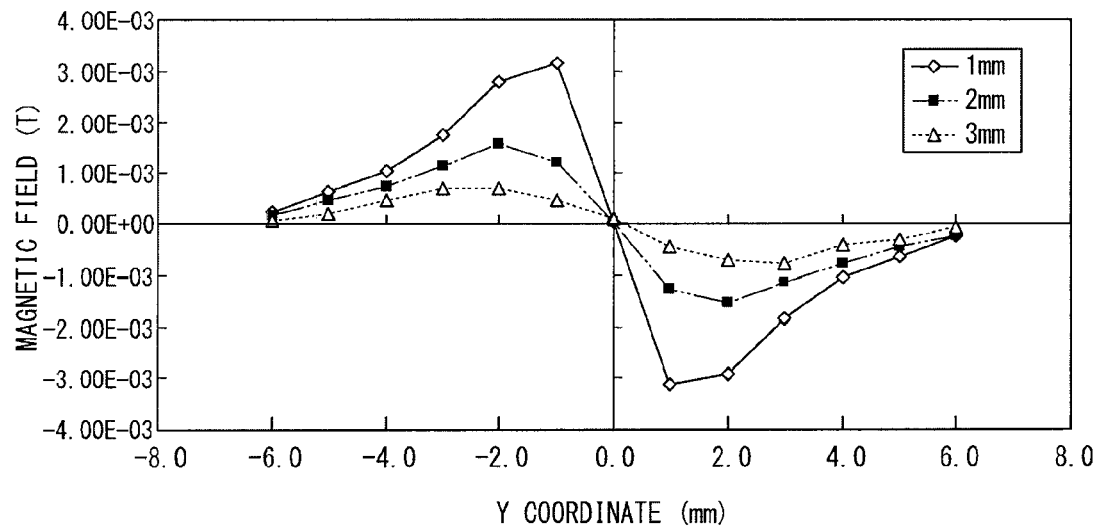
FIG. 5A, FIG. 5B and FIG. 5C are graphs showing simulation results of the strength of the Z-axis direction component of the magnetic field generated from the wire shown in FIG. 1.
Figure 5B:
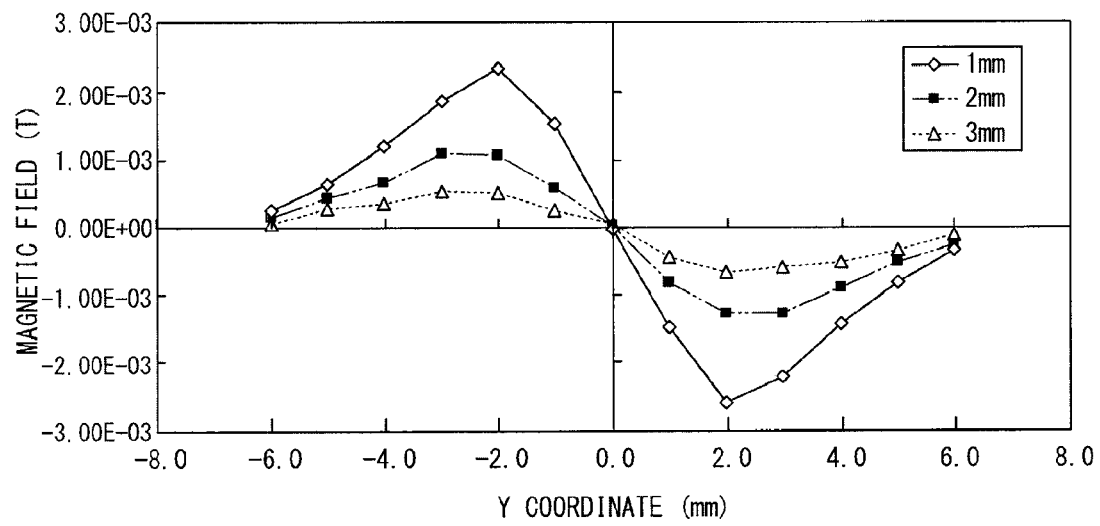
Figure 5C:
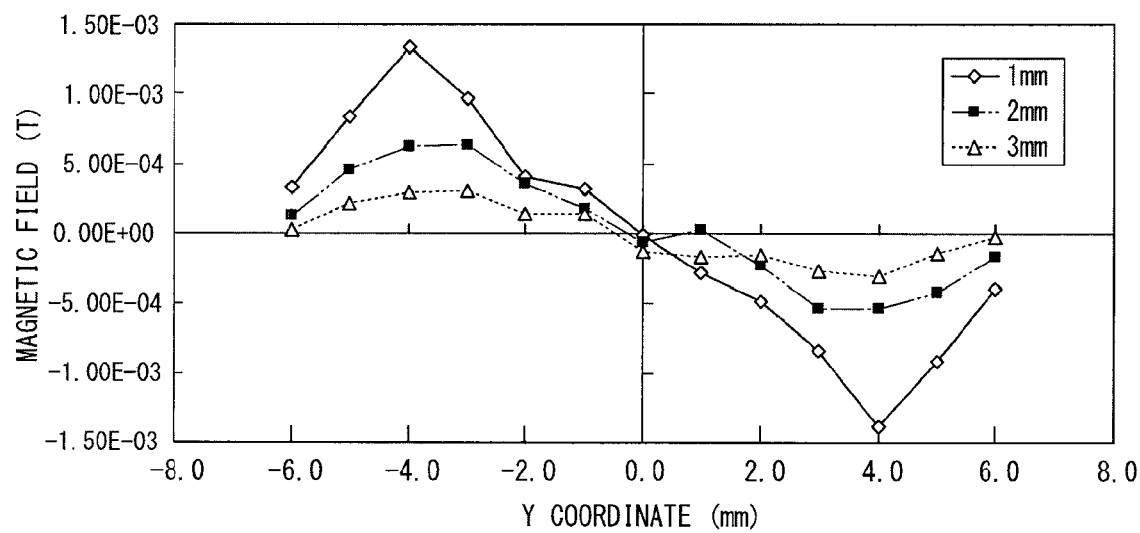

FIGS. 5A, 5B, and 5C present a simulation result for the strength of the Z-axis direction component of the magnetic field generated from the wire 200, when electric current is passed through the wire 200 in the −X-direction, being graphs that show the strength of the generated magnetic field when a 50 A electric current is passed through a wire with a thickness of 0.1 mm.

FIG. 5A is the simulation result for the wire 200 with a width of 2 mm. Similarly, FIG. 5B is a simulation result for the wire 200 with a width of 4 mm, while FIG. 5C is a simulation result for the wire 200 with a width of 8 mm.

The horizontal axis denotes the magnetic field strength computation position (unit: mm) in the width direction (Y-direction) of the wire 200. For the horizontal axis, the surface center of the wire 200 serves as the origin.

The vertical axis denotes the magnetic field strength (unit: T).

The three types of results shown in a single graph represent the respective magnetic field strength calculation positions (unit: mm) in the height direction (Z-direction) of the wire 200. In the Z-direction calculation position, the surface of the wire 200 serves as the origin.

Figure 6:
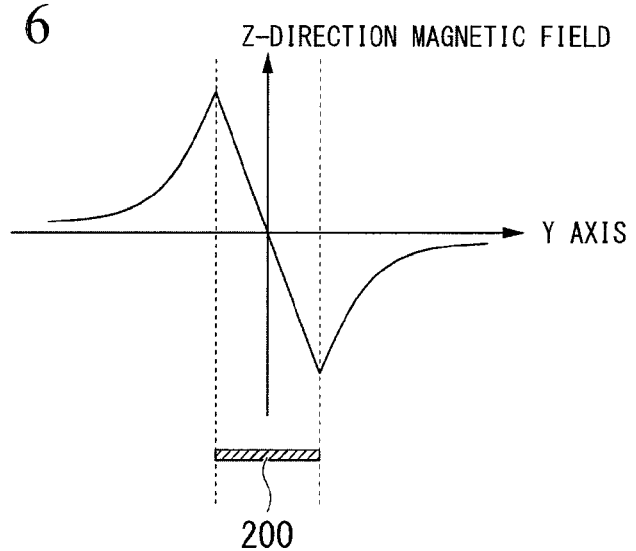
FIG. 6 is a graph that schematically shows the result shown in FIG. 5.

FIG. 6 is a drawing that schematically shows the result shown in FIGS. 5A to 5C. As shown in FIGS. 5A to 5C and FIG. 6, the magnetic field distribution in the Z-direction is point-symmetrical about the origin, and it is evident that when the wire 200 is viewed in cross section, the absolute value of the magnetic field strength shows a peak at the end portions in the width direction thereof. Accordingly, in order to measure the magnetic field component in the Z-direction, it is preferable that the pair of magnetism detecting elements 20a and 20b be arranged so as to overlap planarly with the end portions of the wire 200 in the width direction.

Figure 7A:
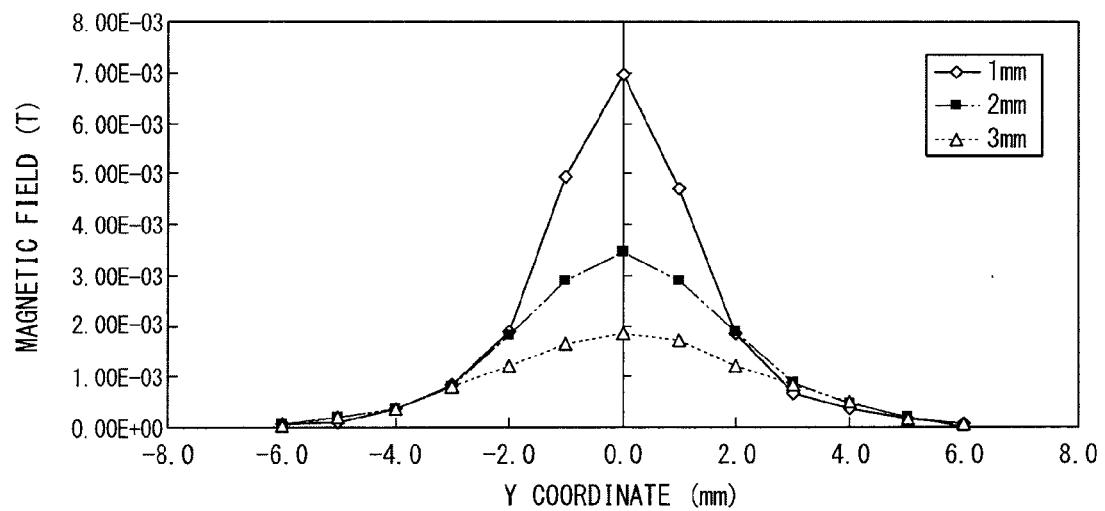
FIG. 7A, FIG. 7B and FIG. 7C are graphs showing simulation results of the strength of the Y-axis direction component of the magnetic field generated from the wire shown in FIG. 1.
Figure 7B:
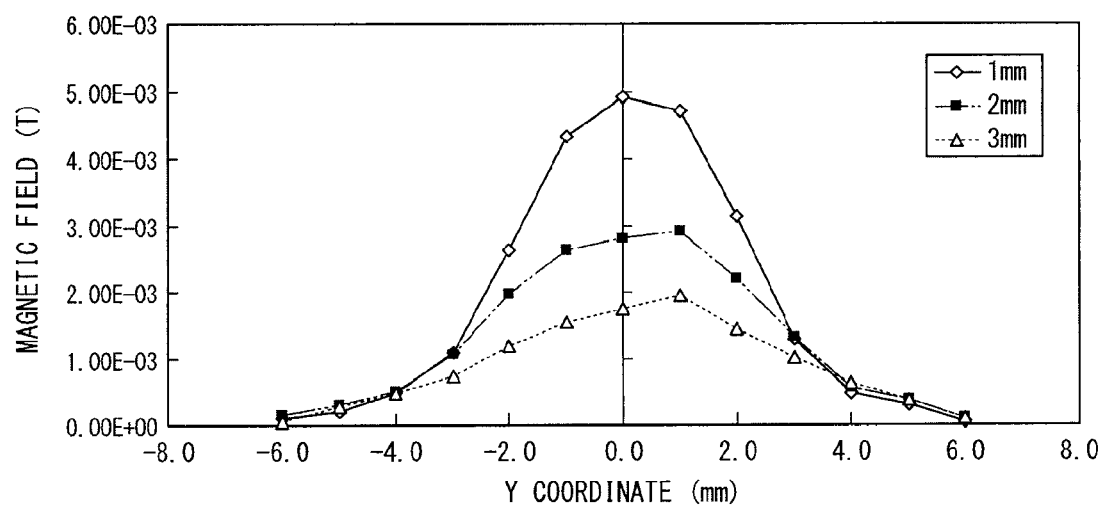
Figure 7C:
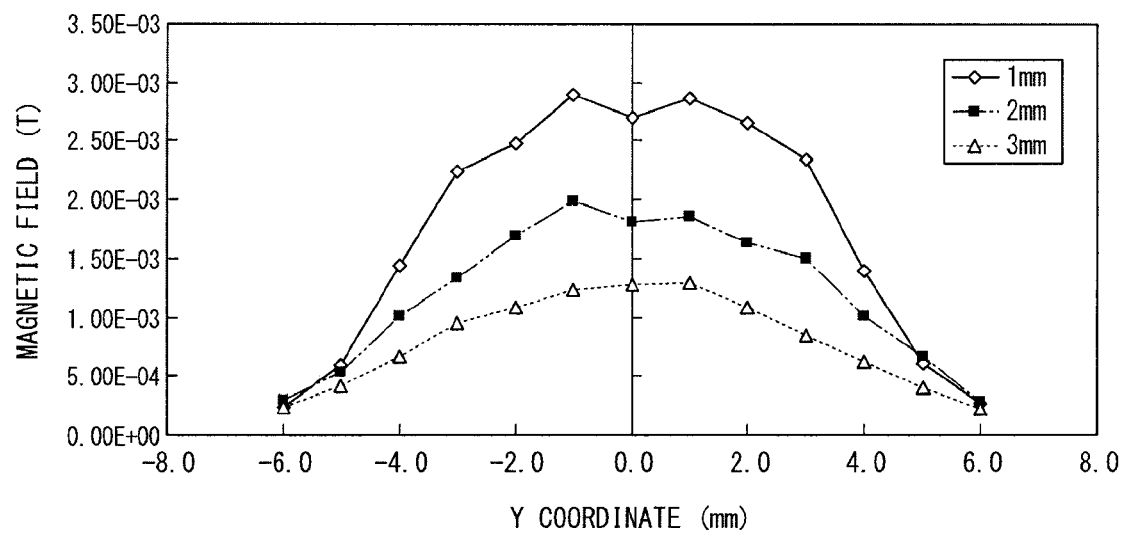

Similarly to FIGS. 5A, 5B and 5C, FIGS. 7A, 7B, and 7C present a simulation result for the strength of the Y-axis direction component in the magnetic field generated from the wire 200, when electric current is passed through the wire 200 in the −X-direction. The graphs of FIGS. 7A, 7B, and 7C are the same as those of FIGS. 5A, 5B, and 5C in terms of having the same horizontal axis, vertical axis, and presenting three types of results in a single graph.

FIG. 7A is the simulation result for the wire 200 with a width of 2 mm. Similarly, FIG. 7B is a simulation result for the wire 200 with a width of 4 mm, while FIG. 7C is a simulation result for the wire 200 with a width of 8 mm.

As shown in FIGS. 7A, 7B, and 7C, the magnetic field distribution in the Y-direction is plane symmetrical with respect to the XZ plane including the origin. That is, the Y-direction magnetic field component can be gradually decreased by the differential operation of the pair of magnetism detecting elements 20a and 20b. During differential operation, appropriate sensitivity correction may be performed. It is evident that by arranging the pair of magnetism detecting elements 20a and 20b symmetrically with respect to the center line L of the wire 200 in the manner of the current measuring device 1000 of the present embodiment, it is possible to offset a Y-direction magnetic field component.

In the current sensor 1 of the present embodiment, the relative distances of the magnetism detecting element 20a and the magnetism detecting element 20b with respect to the wire 200 are equivalent, and moreover their positions in the Z-axis direction are set to be equivalent. For that reason, from the aforementioned simulation results, it is possible to predict that the magnitude of the tangential component Ma that is detected by the magnetism detecting element 20a and the magnitude of the tangential component Mb that is detected by the magnetism detecting element 20b are equivalent, and the Z-axis direction components will be values with different signs (values of opposite phases).

Moreover, in the case of the pair of magnetism detecting elements 20a and 20b being influenced by a disturbance magnetic field DM, the pair of magnetism detecting elements 20a and 20b detect the disturbance magnetic field as a noise component of a magnetic field received from mutually the same direction.

In this kind of current sensor 1, by differential operation of the pair of magnetism detecting elements 20a and 20b, the Z-axis direction components, which are values of mutually opposite phases detected by the magnetism detecting elements 20a and 20b, subjected to addition processing and amplified, and the Y-direction magnetic field component is offset and detected. Moreover, in the current sensor 1, the slope angle of the pair of magnetism detecting elements 20a and 20b with respect to the back surface 10b of the element substrate 10 is known. Therefore, by differentially operating the pair of magnetism detecting elements 20a and 20b while performing correction by the slope angle of the pair of magnetism detecting elements 20a and 20b, it is possible to subject the disturbance magnetic field DM to subtraction processing to remove noise.

The current sensor 1 and the current measuring device 1000 of the present embodiment have the constitutions given above.

According to the current sensor 1 with the constitution as described above, it is possible to provide a current sensor capable of accurately measuring a current value without severing the current path (wire 200) that is the measuring target.

In addition, in the current measuring device 1000 with the constitution as described above, it is possible to provide a current measuring device that has the current sensor 1 as described above and that is capable of accurately measuring the current value of electric current passing through the wire 200.

Note that in the present embodiment, the pair of magnetism detecting elements 20a and 20b are arranged in parallel in plan view, but they are not limited thereto. Provided that the pair of magnetism detecting elements 20a and 20b are capable of detecting the strength of the tangential components Ma and Mb of the induction field M, operation is possible even if the attitude of the pair of magnetism detecting elements 20a and 20b is shifted from the attitude of the present embodiment.

Similarly, in the present embodiment, the pair of magnetism detecting elements 20a and 20b are arranged line-symmetrically with respect to the center line of the wire 200 of the current measuring device 1000, but the arrangement is not limited thereto.

Provided the relative positions of the pair of magnetism detecting elements 20a and 20b with respect to the wire 200 are known, operation is possible even if the attitude of the pair of magnetism detecting elements 20a and 20b is shifted from the attitude of the present embodiment.

In addition, in the present embodiment, the pair of magnetism detecting elements 20a and 20b are arranged planarly overlapping the end portions of the wire 200 in the width direction, but the arrangement positions of the pair of magnetism detecting elements 20a and 20b may be shifted from this position. In this case, since the output value becomes small compared to the case of putting the pair of magnetism detecting elements 20a and 20b at positions overlapping the end portions of the wire 200 in plan view, a constitution that amplifies the output value may be provided.

Also, in the present embodiment, the pair of magnetism detecting elements 20a and 20b are provided on the sloping surfaces 12a and 12b, which are a portion of the inner surface of the grooves 11a and 11b, but they are not limited thereto. For example, instead of providing the grooves 11a and 11b, tapered protruding portions whose width gradually decreases in the direction away from the front surface of the element substrate 10 may be formed, and the pair of magnetism detecting elements 20a and 20b may be arranged on a sloping surface that is a side surface of each protruding portion.

In addition, in the present embodiment, in the current sensor 1 and the current measuring device 1000, the front surface (one surface) 10a of the element substrate 10 is arranged so as to be in the same direction as the surface direction of the XY-plane, but it is not limited thereto. The element substrate 10 is also operable even when arranged with an attitude inclined about the Y-axis.

Second Embodiment

Figure 8:
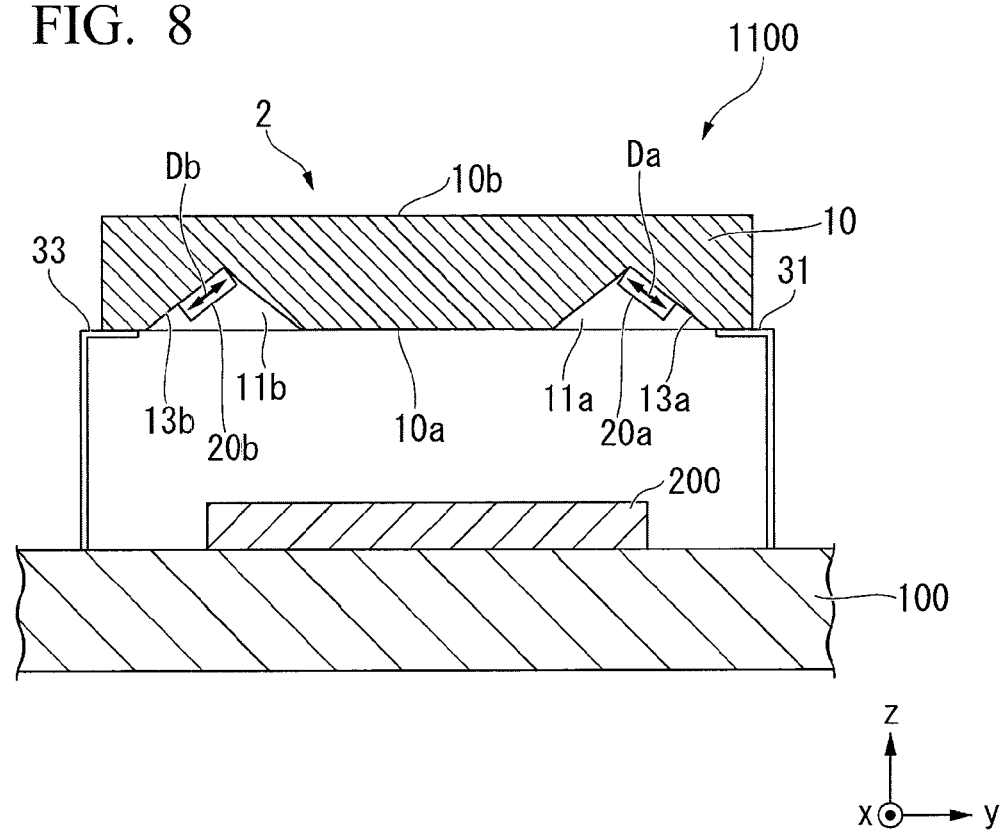
FIG. 8 is a cross-sectional view that shows the current sensor and current measuring device of the second embodiment of the present invention.

FIG. 8 is an explanatory drawing of a current sensor 2 and a current measuring device 1100 according to the second embodiment of the present invention, being a drawing corresponding to FIG. 3A.

The current sensor 2 and the current measuring device 1100 of the present embodiment share portions with the current sensor 1 and the current measuring device 1000. Accordingly, constituent elements of the present embodiment that are in common with the first embodiment shall be denoted by the same reference signs, with detailed descriptions thereof being omitted.

As shown in FIG. 8, the front surface 10a of the element substrate 10 of the current sensor 2, in which the grooves 11a and 11b are provided, is arranged facing the wire 200 (−Z-direction). That is to say, in this embodiment, the front surface 10a of the element substrate 10 is defined as the first surface facing the wire 200. The external connection terminals 31 to 34 extend to the front surface 10a side.

Moreover, the pair of magnetism detecting elements 20a and 20b that the current sensor 2 has are provided on a pair of sloping surfaces 13a and 13b of the grooves 11a and 11b, on the outer side of the element substrate 10. The mutual spacing between the sloping surfaces 13a and 13b gradually decreases in the first direction (+Z-direction) heading from the front surface (first surface) 10a to the back surface (second surface) 10b of the element substrate 10.

The respective attitudes of the pair of magnetism detecting elements 20a and 20b with respect to the front surface 10a and the relative positions of the pair of magnetism detecting elements 20a and 20b with respect to the wire 200 are the same as in the first embodiment. That is to say, the current sensor 2 is provided overlapping the wire 200 in plan view, and spaced apart from the wire 200 in the normal direction of the wiring substrate 100 (+Z-direction). Also, the pair of magnetism detecting elements 20a and 20b are arrayed in the width direction (Y-direction) of the wire 200 in plan view, and disposed on both sides thereof sandwiching the center line L of the wire 200. Moreover, the mutual separation distance of the pair of magnetism detecting elements 20a and 20b provided on the sloping surfaces 13a and 13b as described above gradually decreases in the direction heading from the front surface (first surface) 10a to the back surface (second surface) 10b of the element substrate 10 (the normal direction of the wire 200 or +Z-direction).

Even with the current sensor 2 having such a constitution, it is possible to accurately measure a current value without severing the current path (wire 200) that is the measuring target.

Also, with the current measuring device 1100 having the current sensor 2 with such a constitution, it is possible to accurately measure the current value of electric current passing through the wire 200.

While preferred embodiments of the invention have been described and illustrated above referring to the appended drawings, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, the current measuring device 1000 described in the aforementioned embodiment has one current sensor 1 that is disposed above the wire 200 in the +Z-direction, while the current measuring device 1100 has one current sensor 2 disposed above the wire 200 in the +Z-direction. However, they are not limited thereto, and may also be current measuring devices having a plurality of current sensors.

For example, in a current measuring device having two of the current sensors 1, the two current sensors 1 are arranged above the wire 200 in the +Z-direction at a similar position as the current sensor 1 of FIG. 1. In this case, the two current sensors are adjacently arranged, and the two magnetism detecting elements 20a and the two magnetism detecting elements 20b that the two current sensors 1 have may be bridge-connected.

What is claimed is:

1. A current sensor comprising:
   an element substrate that has a first surface facing a wire to which electric current to be measured is supplied and a second surface positioned on the opposite side of the first surface;
   a pair of sloping surfaces that are formed mutually juxtaposed in the element substrate on parts of the first or the second surface so as to have slope angles by which their mutual spacing gradually decreases in a first direction heading from the first surface to the second surface in a thickness direction of the element substrate;
   a pair of magnetism detecting elements that are respectively attached to the pair of sloping surfaces formed in the element substrate; and
   external connection terminals that are respectively connected to the pair of magnetism detecting elements and that extend in a second direction that is the opposite direction of the first direction,
   wherein the sensitivity directions of the pair of magnetism detecting elements are respectively set so as to slope along the pair of sloping surfaces, and the pair of magnetism detecting elements are to be arranged so as to be positioned on both sides of the wire sandwiching a center line of the wire.

2. The current sensor according to claim 1, wherein the pair of sloping surfaces are formed on the second surface of the element substrate.

3. The current sensor according to claim 1, wherein the pair of sloping surfaces are formed on the first surface of the element substrate.

4. The current sensor according to claim 1, wherein the magnetism detecting elements are magneto-resistance effect elements.

5. A current measuring device comprising:
   a wiring substrate in which a wire is provided on the front surface; and
   a current sensor comprising an element substrate that has a first surface facing the wire and a second surface positioned on the opposite side of the first surface; a pair of sloping surfaces that are formed mutually juxtaposed in the element substrate on parts of the first or the second surface so as to have slope angles by which their mutual spacing gradually decreases in a first direction heading from the first surface to the second surface in a thickness direction of the element substrate; a pair of magnetism detecting elements that are respectively attached to the pair of sloping surfaces formed in the element substrate; and external connection terminals that are respectively connected to the pair of magnetism detecting elements and that extend in a second direction that is the opposite direction of the first direction, the sensitivity directions of the pair of magnetism detecting elements being respectively set so as to slope along the pair of sloping surfaces,
   wherein the current sensor is provided spaced apart from the wire, the pair of magnetism detecting elements are arranged so as to be positioned on both sides thereof sandwiching the center line of the wire, and the separation distance of the pair of magnetism detecting elements gradually decreases in the normal direction of the wire.

6. The current measuring device according to claim 5, wherein the pair of magnetism detecting elements are arranged symmetrically with respect to the center line of the wire.

7. The current measuring device according to claim 5, wherein the pair of magnetism detecting elements are arranged at positions facing the end portions of the wire in the width direction.

* * * * *